United States Patent
Katti

(10) Patent No.: US 8,374,020 B2
(45) Date of Patent: Feb. 12, 2013

(54) REDUCED SWITCHING-ENERGY MAGNETIC ELEMENTS

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 207 days.

(21) Appl. No.: 12/916,238

(22) Filed: Oct. 29, 2010

(65) Prior Publication Data
US 2012/0106233 A1    May 3, 2012

(51) Int. Cl.
*G11C 11/00* (2006.01)
*G11C 5/08* (2006.01)
*G11C 11/14* (2006.01)

(52) U.S. Cl. .......................... 365/158; 365/66; 365/171

(58) Field of Classification Search .................. 365/158, 365/171, 66
See application file for complete search history.

(56) References Cited

U.S. PATENT DOCUMENTS

| | | | |
|---|---|---|---|
| 5,739,704 A | 4/1998 | Clark | |
| 6,034,887 A | 3/2000 | Gupta et al. | |
| 6,050,335 A | 4/2000 | Parsons | |
| 6,343,032 B1 | 1/2002 | Black et al. | |
| 6,351,409 B1 | 2/2002 | Rizzo et al. | |
| 6,526,559 B2 | 2/2003 | Schiefele et al. | |
| 6,657,888 B1 | 12/2003 | Doudin et al. | |
| 6,809,900 B2 | 10/2004 | Covington | |
| 6,950,335 B2 | 9/2005 | Dieny et al. | |
| 6,985,318 B2 | 1/2006 | Clinton et al. | |
| 6,985,930 B2 | 1/2006 | Oikawa | |
| 7,075,807 B2 | 7/2006 | Leuschner et al. | |
| 7,096,437 B2 | 8/2006 | Ditto et al. | |
| 7,116,576 B2 | 10/2006 | Smith et al. | |
| 7,218,139 B1 | 5/2007 | Young et al. | |
| 7,241,631 B2 | 7/2007 | Huai et al. | |
| 7,267,999 B2 | 9/2007 | Drewes | |
| 7,332,781 B2 | 2/2008 | Nozieres et al. | |
| 7,379,321 B2 | 5/2008 | Ravelosona et al. | |
| 7,394,684 B2 | 7/2008 | Inokuchi et al. | |
| 7,397,285 B2 | 7/2008 | Agan et al. | |

(Continued)

FOREIGN PATENT DOCUMENTS

| EP | 0 575 738 A2 | 12/1993 |
|---|---|---|
| EP | 2 172 969 A1 | 4/2010 |

(Continued)

OTHER PUBLICATIONS

S. Matsunaga et al., "MTJ-Based Nonvolatile Logic-In-Memory Circuit, Future Prospects and Issues," Apr. 20-24, 2009, 3 pages, retrieved from http://www.date-conference.com/proceedings/PAPERS/2009/DATE09/PDFFILES/05.2_1.PDF.

(Continued)

*Primary Examiner* — Ly D Pham
(74) *Attorney, Agent, or Firm* — Shumaker & Sieffert, P.A.

(57) ABSTRACT

A system includes a continuous thin-film ferromagnetic layer, N magnetic tunnel junction (MTJ) devices, and N write structures. The continuous thin-film ferromagnetic layer includes N modified regions. Each of the N modified regions is configured to stabilize a magnetic domain wall located in the continuous thin-film ferromagnetic layer. Each of the N MTJ devices includes one of N portions of the continuous thin-film ferromagnetic layer. Adjacent MTJ devices of the N MTJ devices are separated by one of the N modified regions. Each of the N write structures is configured to receive current and generate a magnetic field that magnetizes a different one of the N portions of the continuous thin-film ferromagnetic layer. N is an integer greater than 2.

20 Claims, 13 Drawing Sheets

U.S. PATENT DOCUMENTS

| | | |
|---|---|---|
| 7,400,166 B2 | 7/2008 | Bangert |
| 7,425,377 B2 | 9/2008 | Fullerton et al. |
| 7,465,502 B2 | 12/2008 | Gusliyenko |
| 7,596,018 B2 | 9/2009 | Johnson |
| 7,630,231 B2 | 12/2009 | Miltat et al. |
| 7,684,233 B2 | 3/2010 | Lim et al. |
| 7,710,766 B2 | 5/2010 | Mullner et al. |
| 7,719,881 B2 | 5/2010 | Bangert |
| 7,825,686 B2 | 11/2010 | Hoeink et al. |
| 7,852,665 B2 | 12/2010 | Chen et al. |
| 7,870,472 B2 | 1/2011 | Thorp et al. |
| 7,940,592 B2 | 5/2011 | Reed et al. |
| 8,027,206 B2 | 9/2011 | Yoon et al. |
| 8,159,864 B2 | 4/2012 | Yoon et al. |
| 2003/0227907 A1 | 12/2003 | Choi et al. |
| 2004/0108561 A1 | 6/2004 | Jeong |
| 2006/0125034 A1 | 6/2006 | Ohba et al. |
| 2006/0145806 A1 | 7/2006 | Kim et al. |
| 2006/0176620 A1 | 8/2006 | Ravelosona et al. |
| 2007/0063237 A1 | 3/2007 | Huai et al. |
| 2007/0091509 A1 | 4/2007 | Yi et al. |
| 2007/0224454 A1 | 9/2007 | Ingvarsson et al. |
| 2008/0100345 A1 | 5/2008 | Bratkoviski et al. |
| 2008/0150578 A1 | 6/2008 | Kiel et al. |
| 2008/0238475 A1 | 10/2008 | Chua-Eoan et al. |
| 2008/0278196 A1 | 11/2008 | Ditto et al. |
| 2009/0027949 A1 | 1/2009 | Koga et al. |
| 2009/0046501 A1 | 2/2009 | Ranjan et al. |
| 2009/0067225 A1 | 3/2009 | Mryasov et al. |
| 2009/0103354 A1 | 4/2009 | Yoon et al. |
| 2009/0296462 A1 | 12/2009 | Kent et al. |
| 2009/0317923 A1 | 12/2009 | Sun et al. |
| 2009/0323402 A1 | 12/2009 | Li et al. |
| 2010/0039136 A1 | 2/2010 | Chua-Eoan et al. |
| 2010/0078723 A1 | 4/2010 | Bertin et al. |
| 2010/0080048 A1 | 4/2010 | Liu et al. |
| 2010/0080054 A1 | 4/2010 | Abe |
| 2010/0090262 A1 | 4/2010 | Saito et al. |
| 2010/0110757 A1 | 5/2010 | Ma et al. |
| 2010/0142260 A1 | 6/2010 | Yoon et al. |
| 2010/0148288 A1 | 6/2010 | Johnson |
| 2010/0194431 A1 | 8/2010 | Chua-Eoan et al. |
| 2010/0219858 A1 | 9/2010 | Ditto et al. |
| 2010/0315123 A1 | 12/2010 | Niemier et al. |
| 2011/0006807 A1 | 1/2011 | Schneiderwind |
| 2011/0007558 A1 | 1/2011 | Mryasov et al. |
| 2011/0026336 A1 | 2/2011 | Huang et al. |
| 2012/0014166 A1 | 1/2012 | Ma et al. |
| 2012/0081950 A1 | 4/2012 | Slaughter |

FOREIGN PATENT DOCUMENTS

| | | |
|---|---|---|
| WO | 2010/029326 A1 | 3/2010 |
| WO | 2010024126 A1 | 3/2010 |

OTHER PUBLICATIONS

Y. Nozaki et al., "Size Dependence of Switching Current and Energy Barrier in the Magnetization Reversal of Rectangular Magnetic Random Access Memory Cell," Journal of Applied Physics, vol. 93, No. 10, 3 pages, May 15, 2003.

Lybertatos et al., "Thermal Effects in the High-Speed Switching of the Magnetization of Fine Gains," Published in Intermag Europe 2002 Digest of Technical Papers, 2002 IEEE International Magnetics Conference, Apr. 28-May 2, 2002. Abstract only, retrieved from the internet at http://sciencelinks.jp/j-east/article/200312/000020031203A0344537.php.

Mukherjee et al., "Switching of Composite Media by Wall Propagation," Published in Journal of Applied Physics, vol. 99, No. 8, Apr. 15, 2006. Citation retrieved from DailogWeb. Abstract retrieved from the Internet at http://jap.aip.org/japiau/v99/i8/p08q909_s1?isAuthorized=no.

M. Caruso et al., "A New Prospective on Magnetic Field Sensing," 19 pgs., May 1998 downloaded from http://www.ssec.honeywell.com/magnetic/datasheets/new_pers.pdf.

G. A. Prinz, "Magnetoelectronics Applications," Journal of Magnetism and Magnetic Materials 200, pp. 57-68, 1999.

R. Katti, "Magnetic Logic Gate", filed Oct. 29, 2010.

R. Katti, "Magnetic Logic Gate," filed Oct. 29, 2010.

Mukherjee et al., "Switching of Composite Media by Wall Propagation," Journal of Applied Physics, vol. 99, No. 8, Apr. 15, 2006, 3 pages.

Lybertatos et al., "Thermal Effects in the High-Speed Switching of the Magnetization of Fine Grains," Published in Intermag Europe 2002 Digest of Technical Papers, 2002 IEEE International Magnetics Conference, Apr. 28-May 2, 2002, 1 page.

Li et al., "Ultrahigh-Speed Reconfigurable Logic Gates Based on Four-Wave Mixing in a Semiconductor Optical Amplifier," IEEE Phonics Technology Letters, vol. 18, No. 12, Jun. 15, 2006, 3 pages.

OR Operation
($I_{Ref}$ set to a value > Intermediate Current)

| A | B | R, I | Out |
|---|---|---|---|
| (0)↓ | (0)↓ | Low R, High I | (0) |
| (0)↓ | (1)→ | Int R, Int I | (1) |
| (1)→ | (0)↓ | Int R, Int I | (1) |
| (1)→ | (1)→ | High R, Low I | (1) |

FIG. 8B

AND Operation
($I_{Ref}$ set to a value < Intermediate Current)

| A | B | R, I | Out |
|---|---|---|---|
| (0)↓ | (0)↓ | Low R, High I | (0) |
| (0)↓ | (1)→ | Int R, Int I | (0) |
| (1)→ | (0)↓ | Int R, Int I | (0) |
| (1)→ | (1)→ | High R, Low I | (1) |

FIG. 8A

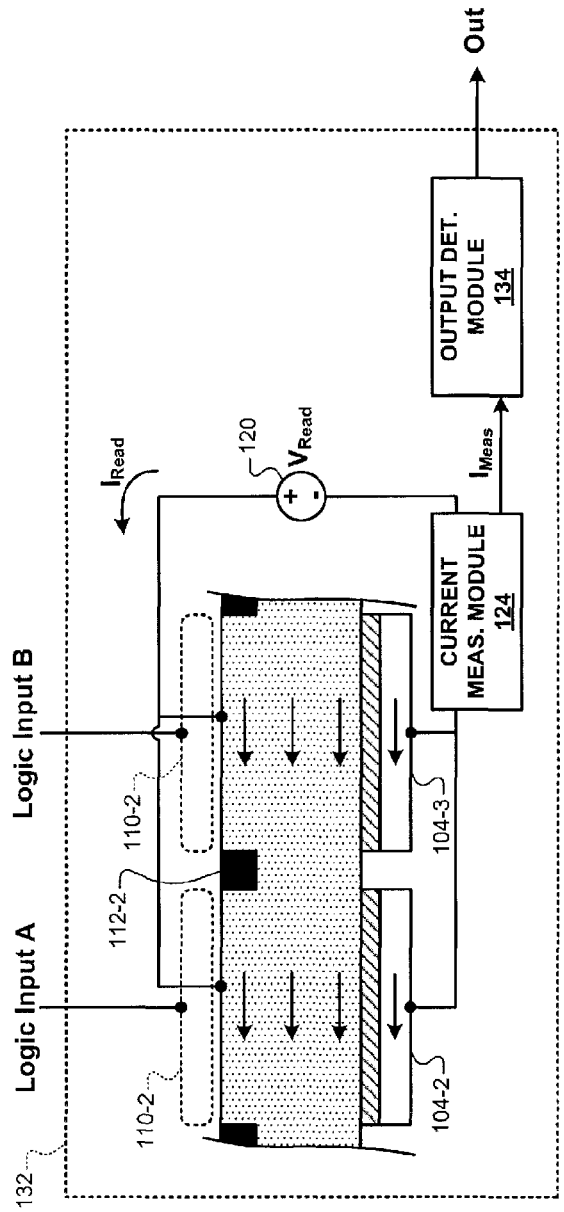

US 8,374,020 B2

REDUCED SWITCHING-ENERGY MAGNETIC ELEMENTS

TECHNICAL FIELD

The disclosure relates to magnetic elements, and, more particularly, to magnetic elements having reduced switching energy.

BACKGROUND

A magnetic tunnel junction (MTJ) device includes two ferromagnetic layers separated by a thin insulator. A relative magnetization direction of each of the ferromagnetic layers determines a state of an MTJ. An MTJ typically includes two states of resistance, a low resistance state and a high resistance state. An MTJ is in a high resistance state when both of the ferromagnetic electrodes of the MTJ are magnetized in the same direction. An MTJ is in a low resistance state when the ferromagnetic layers are magnetized in opposite directions. Relative magnetization directions of an MTJ device may be changed by an applied external magnetic field.

MTJ devices may find application in magnetic storage devices. For example, MTJ devices find application in read-heads of hard disk drives in which the magnetic state of the hard disk platter may be determined based on the resistance of an MTJ read head flying over the platter. MTJ devices may also find application in magnetoresistive random access memory in which data may be stored in and read from MTJ devices.

SUMMARY

An array of magnetic tunnel junction (MTJ) devices according to the present disclosure may share a continuous free layer (hereinafter "free layer"). Each of the MTJ devices of the array may include a portion of the free layer, a pinned layer, and an insulating layer that is sandwiched between the pinned layer and the free layer. The free layer of the present disclosure may also include modifications which are located between each of the MTJ devices of the array. The modifications may serve to stabilize magnetic domain walls located in the free layer. The modifications may include, but are not limited to, notches in the free layer, ion implanted regions in the free layer, and a thin film strain layer deposited over the free layer.

A plurality of write-current structures may be fabricated in proximity to the MTJ devices. Each write-current structure may conduct current and generate a magnetic field that magnetizes a corresponding portion of the free layer. For example, each write-current structure may be configured to magnetize a free layer of a corresponding MTJ device. Write-current structures may magnetize the free layer of each MTJ in one of at least two directions.

A magnetic domain wall may form in the free layer between two adjacent MTJ devices when the adjacent MTJ devices are magnetized in different directions. The modification to the free layer between the two adjacent MTJ devices may serve to stabilize the location of this domain wall that is present in the region of the modification. If the modification was not present in the free layer, the domain wall formed in the free layer would be freer to move, for example, in the presence of thermal energy. In turn, if the domain wall was free to move, the state of the MTJ device that includes the domain wall in the free layer would be uncertain.

In summary, the write-current structures may magnetize the portions of the free layer corresponding to the MTJ devices and therefore may set up domain walls between the MTJ devices (i.e., at the modifications of the free layer). The modifications may then maintain the domain walls at the locations where the domain walls are formed since it may be more energetically favorable for the domain walls to reside at the modifications than to move to other portions of the free layer and away from the modifications.

An array of MTJ devices sharing a continuous free layer as described above may be included in a magnetic logic system. For example, a magnetic logic system according to the present disclosure may include two MTJ devices and two corresponding write-current structures. The write-current structures of the magnetic logic system may receive current inputs and set the state of the two MTJ devices. Output circuitry of the magnetic logic system may then determine the combined state (i.e., the output of the system) of the two MTJ devices based on the resistance of the two MTJ devices. As described hereinafter, such a magnetic logic system may perform various logic operations, such as AND, OR, or XOR operations. Furthermore, the magnetic logic system as described herein may be referred to as a non-volatile logic system, since the most recent inputs (e.g., the current inputs to the write-current structures) are stored in the free layer until rewritten.

In one example according to the present disclosure, a system comprises a first ferromagnetic layer, a first MTJ device, a second MTJ device, and first and second write structures. The first MTJ device comprises a first portion of the first ferromagnetic layer, a first pinned layer, and a first insulating layer disposed between the first portion of the first ferromagnetic layer and the first pinned layer. The second MTJ device comprises a second portion of the first ferromagnetic layer, a second pinned layer, and a second insulating layer disposed between the second portion of the first ferromagnetic layer and the second pinned layer. The first and second write structures are configured to receive current and generate a magnetic field that magnetizes the first and the second portions of the first ferromagnetic layer, respectively.

In some implementations, the system further comprises a modification to the first ferromagnetic layer between the first and second portions of the first ferromagnetic layer. The modification is configured to stabilize a magnetic domain wall located in the region of the modification. In some examples, the modification includes an ion implantation region. In other examples, the modification includes a notch that is defined in the first ferromagnetic layer. In still other examples, the modification comprises a thin-film deposited over the first ferromagnetic layer. The thin-film is deposited such that the thin-film introduces strain in the first ferromagnetic layer and stabilizes a domain wall located in the region of the thin-film.

In another example according to the present disclosure, a system comprises a continuous thin-film ferromagnetic layer, N MTJ devices, and N write structures. The continuous thin-film ferromagnetic layer comprises N modified regions. Each of the N modified regions is configured to stabilize a magnetic domain wall located in the continuous thin-film ferromagnetic layer. Each of the N MTJ devices comprises one of N portions of the continuous thin-film ferromagnetic layer. Adjacent MTJ devices of the N MTJ devices are separated by one of the N modified regions. Each of the N write structures is configured to receive current and generate a magnetic field that magnetizes a different one of the N portions of the continuous thin-film ferromagnetic layer. N is an integer greater than 2. In some implementations, each of the N modified regions include at least one of an ion implantation region, a notch defined in the continuous thin-film ferromagnetic layer, or a strained region defined by a thin-film deposited over the modified region.

In another example according to the present disclosure, a method comprises fabricating first and second MTJ devices adjacent to one another such that the first and second MTJ devices share a continuous ferromagnetic layer. The method further comprises modifying the continuous ferromagnetic layer at a location between the first and second MTJ devices such that the modification is configured to stabilize a magnetic domain wall located in the continuous ferromagnetic layer at the location. Additionally, the method comprises fabricating first and second write structures configured to receive current and generate a magnetic field that magnetizes first and the second portions of the continuous ferromagnetic layer corresponding to the first and second MTJ devices, respectively.

In some implementations, modifying the continuous ferromagnetic layer includes forming a notch in the surface of the continuous ferromagnetic layer at the location between the first and second MTJ devices. In other implementations, modifying the continuous ferromagnetic layer includes implanting ions in the continuous ferromagnetic layer at the location between the first and second MTJ devices. In still other implementations, modifying the continuous ferromagnetic layer includes depositing a thin-film over the continuous ferromagnetic layer at the location between the first and second MTJ devices. The thin-film is configured such that the thin-film introduces strain in the continuous ferromagnetic layer and stabilizes a domain wall at the location.

The details of one or more examples are set forth in the accompanying drawings and the description below. Other features, objects, and advantages will be apparent from the description and drawings, and from the claims.

BRIEF DESCRIPTION OF THE DRAWINGS

FIG. 8A shows a truth table for an AND operation performed by the example magnetic logic system of FIG. 7.

FIG. 8B shows a truth table for an OR operation performed by the example magnetic logic system of FIG. 7.

FIG. 9A is a functional block diagram that shows an example magnetic logic system that implements an XOR operation.

FIG. 9B shows a truth table for the XOR operation performed by the example magnetic logic system of FIG. 9A.

DETAILED DESCRIPTION

Figure 1:
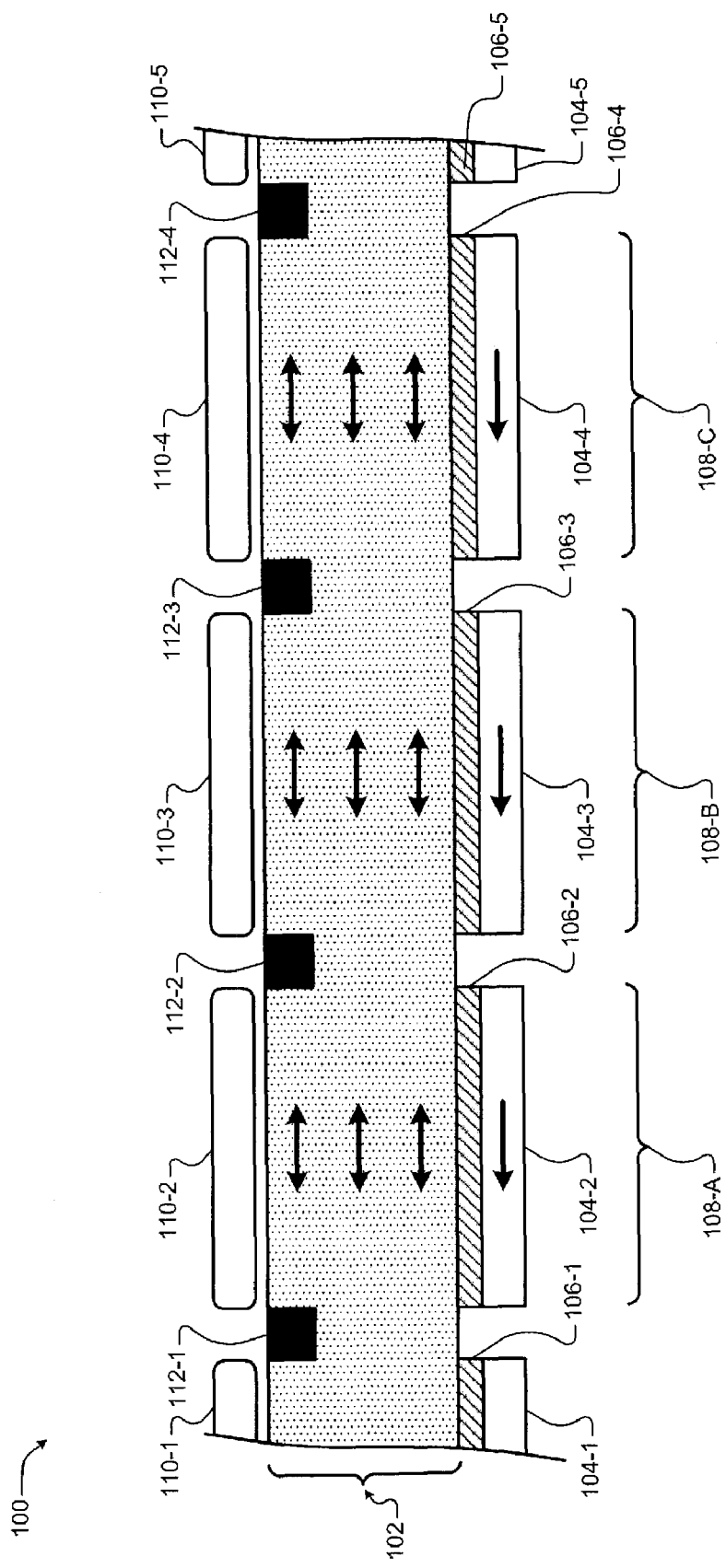
FIG. 1 shows a layered view of an array of magnetic tunnel junction (MTJ) devices that share a common free magnetic layer.

FIG. 1 shows an array 100 of magnetoresistive devices that share a common free magnetic layer 102. Free layer 102 is a continuous layer of magnetic material that may form a common electrode among the array 100 of magentoresistive devices. The magnetization direction of free layer 102 may store information. Accordingly, free layer 102 may also be referred to as a storage layer. Array 100 of magnetoresistive devices may be fabricated on a substrate (not shown). The substrate may include, for example, a silicon substrate (e.g., bulk silicon, silicon-on-insulator, etc.).

Each of the magnetoresistive devices of array 100 includes three layers: a pinned layer, an insulating layer, and free layer 102. Pinned layers 104-1, 104-2, 104-3, 104-4, and 104-5 (collectively "pinned layers 104") for each of the magnetoresistive devices may be separated from one another. In other words, pinned layers 104 may be insulated from one another. Insulating layers 106-1, 106-2, 106-3, 106-4, and 106-5 (collectively "insulating layers 106") separate the pinned layers 104 of the magnetoresistive devices from free layer 102. Although insulating layers 106 are illustrated as separated from one another, in some examples, insulating layers 106 may form a single continuous layer along free layer 102. Although pinned layers 104 are illustrated as separated from one another, in some examples, pinned layers 104 may form a single continuous layer along a single continuous insulating layer.

Each magnetoresistive device is defined by one of pinned layers 104, one of insulating layers 106, and an area of free layer 102 that interfaces with the one of insulating layers 106 and the one of pinned layers 104. For example, pinned layer 104-2, insulating layer 106-2, and free layer 102 form a first magnetoresistive device 108-A. Pinned layer 104-3, insulating layer 106-3, and free layer 102 form a second magentoresistive device 108-B. Pinned layer 104-4, insulating layer 106-4, and free layer 102 form a third magnetoresistive device 108-C. Since magnetoresistive devices 108-A, 108-B, 108-C may generally include an insulating layer sandwiched between two ferromagnetic layers (e.g., pinned layers 104 and free layer 102), magnetoresistive devices 108-A, 108-B, 108-C may be referred to as magnetic tunnel junctions (MTJs) 108-A, 108-B, 108-C.

Pinned layers 104 may include ferromagnetic materials, such as Co, Ni, Fe, and their binary and ternary alloys. Additionally, or alternatively, pinned layers 104 may include manganese alloys used to provide pinning if pinning by means of thickness alone is not desired. The thickness of pinned layer 104 may be on the order of 1 nm or greater, for example. Pinned layers 104 may each be magnetized. The direction of magnetization for each of pinned layers 104 is indicated using a left facing arrow "←." Accordingly, as illustrated in this disclosure, pinned layers 104 may each be magnetized in the same direction. FIG. 1 shows pinned layers 104 magnetized in an in-plane direction, however other directions of magnetization are contemplated. Pinned layers 104 generally serve as a reference layer, against which the direction of magnetization of free layer 102 is compared. Although pinned layers 104 are illustrated as magnetized "in-plane" and in the same direction, in some implementations, pinned layers 104 may be magnetized "perpendicular-to-plane" and/or in different directions.

Free layer 102 may include various ferromagnetic materials. For example, free layer 102 may include, but is not limited to, Nickel-Iron, including permalloy, Nickel-Iron ternary alloys, CoFe, and Cobalt-containing ternary alloys. The thickness of free layer 102 may be on the order of 1 nm or greater, for example.

Since free layer 102 may be a continuous layer of material, free layer 102 may interface with a plurality of insulating layers 106 that form an insulating barrier between free layer 102 and pinned layers 104. Insulating layers 106 may be a thin oxide layer, e.g., aluminum oxide or magnesium oxide. The thickness of insulating layers 106 may be on the order of 1 nm, for example.

Application of a voltage across insulating layers 106 (e.g., by connection of a voltage source to free layer 102 and pinned layers 104) may generate tunneling current through each of the MTJs 108-A, 108-B, 108-C. As described hereinafter, the tunneling current generated through MTJs 108-A, 108-B, 108-C may depend on the magnetization directions of pinned layers 104 relative to free layer 102.

Illustrated above free layer 102 in FIG. 1 are write-current structures 110-1, 110-2, 110-3, 110-4, 110-5 (collectively "write structures 110") that conduct current and generate a magnetic field. The plurality of write structures 110 may be associated with continuous free layer 102, and accordingly, the plurality of write structures 110 may "write to" (i.e., magnetize) free layer 102. Write structures 110 may include a metal layer, e.g., Al, Cu, AlCu, W, etc. Thickness may be on the order of 100 nm, for example, depending on current carrying requirements. Write structures 110 are deposited adjacent to (e.g., above), but insulated from, free layer 102.

Generally, write structures 110 may be insulated from free layer 102. The separation, illustrated in FIG. 1, between write structures 110 and free layer 102 represents insulation between write structures 110 and free layer 102. In other examples, when free layer 102 includes a magnetic insulating layer, e.g., a magnetic oxide or ferrimagnet such as an FeO compound, write structures 110 may be deposited directly on free layer 102. For example, write structures 110, when deposited directly on free layer 102, may include a metal layer, such as Al, Cu, AlCu, W, etc, having a thickness on the order of 100 nm.

A write circuit (not shown in FIG. 1) may generate current through write structures 110 to generate a magnetic field around write structures 110. The magnetic field generated around write structures 110 may magnetize portions of free layer 102 adjacent to a corresponding write structure 110. For example, passing current through write structure 110-2 may magnetize a portion of free layer 102 adjacent to (e.g., under) write structure 110-2 and above pinned layer 104-2 and insulating layer 106-2. Similarly, passing current through write structure 110-3 may magnetize a portion of free layer 102 under write structure 110-3 and above pinned layer 104-3 and insulating layer 106-3.

The direction of current passed through write structures 110 controls the direction of the magnetic field generated by write structures 110, and accordingly, controls the direction of magnetization of free layer 102 adjacent to write structures 110. In general, portions of free layer 102 associated with write structures 110 may be magnetized in one of two directions, referred to as a "first direction" and a "second direction." The first direction may be opposite to the second direction. A left facing arrow "←" may indicate magnetization in the first direction and a right facing arrow "→" may indicate magnetization in the second direction. Directions of magnetization of free layer 102 are illustrated as double ended arrows "↔" in FIG. 1 in order to illustrate that free layer 102 may be magnetized in either the first or second direction by write structures 110. Generating a current having a first direction through a write structure 110 may magnetize the adjacent portion of free layer 102 in the first direction. Generating current through a write structure 110 having a second direction, opposite to the first direction, may magnetize the adjacent portion of free layer 102 in the second direction.

In summary, controlling the direction of current through write structures 110 controls a direction of magnetization of free layer 102 adjacent to write structures 110, and therefore controls the direction of magnetization of an electrode of each of the MTJs 108-A, 108-B, 108-C. In this manner, the resistance of each of MTJs 108-A, 108-B, 108-C may be controlled. For example, controlling a direction of current through write structure 110-2 may control a direction of magnetization of free layer 102 adjacent to write structure 110-2 (i.e., between insulating layer 106-2 and write structure 110-2). Control of the direction of magnetization of free layer 102 adjacent to write structure 110-2 in turn controls the resistance of MTJ 108-A.

Free layer 102 may maintain a previously magnetized state (i.e., direction of magnetization) in the absence of further application of write currents through write structures 110. In other words, the direction of magnetization of free layer 102 is generally changed, from one stable state to another stable state, by application of a write current to write structures 110.

Free layer 102 may include various modifications 112-1, 112-2, 112-3, 112-4 that may be referred to hereinafter as "domain wall pinning sites 112," or "pinning sites 112." Pinning sites 112 may be modifications to free layer 102 that stabilize magnetic domain walls in free layer 102 that are positioned near (e.g., beneath) pinning sites 112. For example, pinning sites 112 may stabilize domain walls present in free layer 102 between adjacent MTJs when adjacent MTJs are magnetized in different directions.

Modifications to free layer 102 that stabilize domain walls in free layer 102 may include, but are not limited to, notching of free layer 102, ion implantation in free layer 102, and/or deposition of a stress layer over free layer 102 at pinning sites 112. Although, notching of free layer 102, ion implantation in free layer 102, and deposition over free layer 102 are disclosed as modifications that stabilize domain walls in free layer 102, it is contemplated that other modifications to free layer 102 at the pinning sites 112 may stabilize domain walls in free layer 102.

Figure 2A:
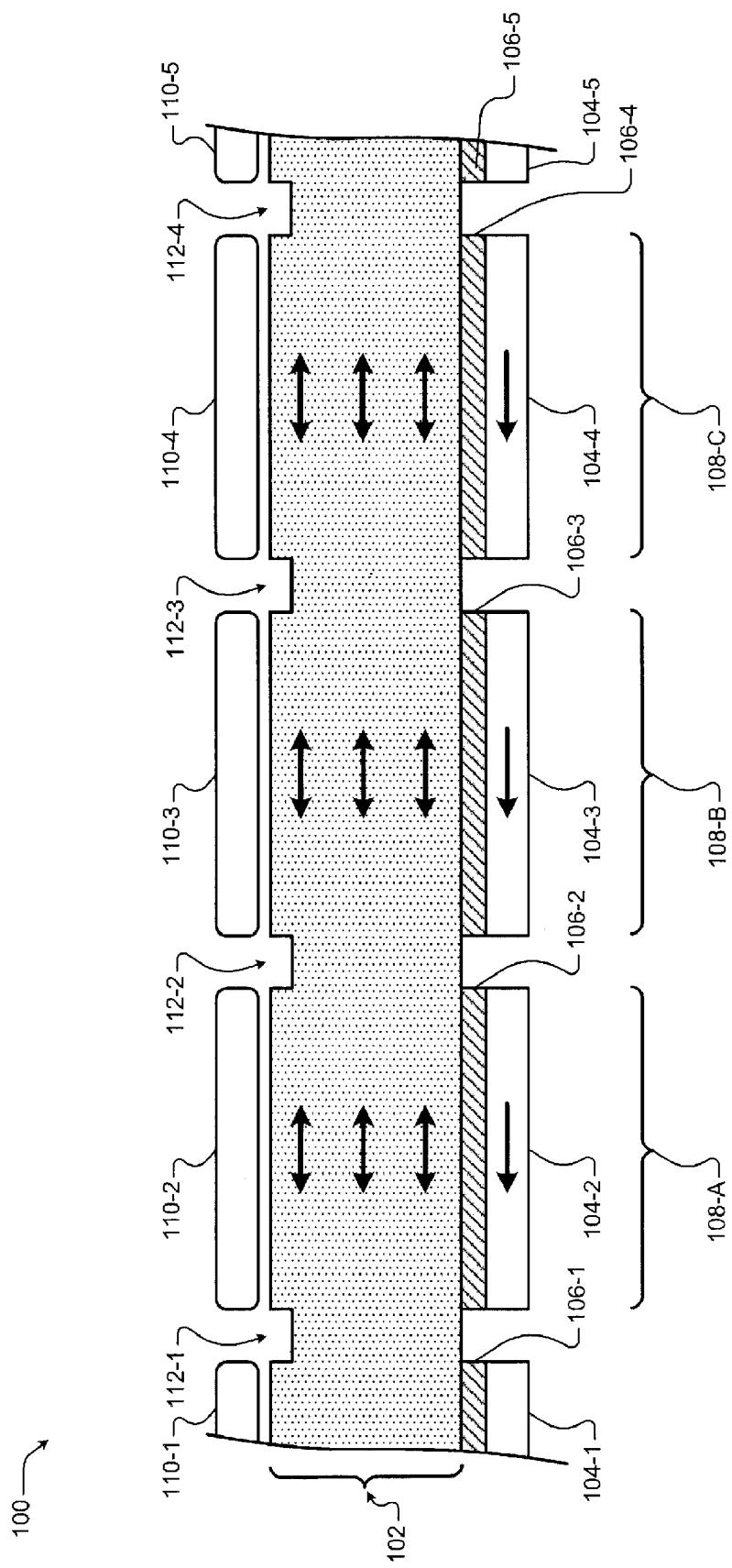
FIG. 2A shows an example array of MTJs that includes notches between the MTJs.

Pinning sites 112 may represent notches in free layer 102. FIG. 2A illustrates an example array 100 of MTJs 108-A, 108-B, 108-C that include notches 112 at the pinning sites 112. For example, each of pinning sites 112 may be a notch in continuous free layer 112 between each of the MTJs 108-A, 108-B, 108-C that share free layer 102. Notches may be formed in free layer 102 using photolithographic and etching techniques (e.g., wet or dry). For example, free layer 102 may be selectively masked using photolithographic techniques to expose areas of free layer 102 corresponding to pinning sites 112. Subsequently, exposed areas of free layer 102 may be etched to form notches at pinning sites 112. In some examples, the depth of the notches may be approximately less than 10% of the total thickness of free layer 102. The absolute depth of the notches used to stabilize domain walls may depend on the thickness of free layer 102. The cross-sections of the notches can include rectangular, square, triangular, elliptical, and/or other irregular shapes that provide modulation.

In some examples, pinning sites 112 may represent areas of free layer 102 that are modified by ion implantation. Accordingly, each of pinning sites 112 may be an ion implanted region in free layer 102 between each of MTJs 108-A, 108-B, 108-C that share free layer 102. Ion implantation in free layer 102 may be performed, for example, after a photolithographic process has defined pinning sites 112 in free layer 102. Ion implantation may cause local strain in free layer 102 at pinning sites 112. Pinning sites 112 may be formed by ion implantation in lieu of, or in addition to, notching. For example, each of pinning sites 112 may include notches and/or be modified by ion implantation.

Figure 2B:
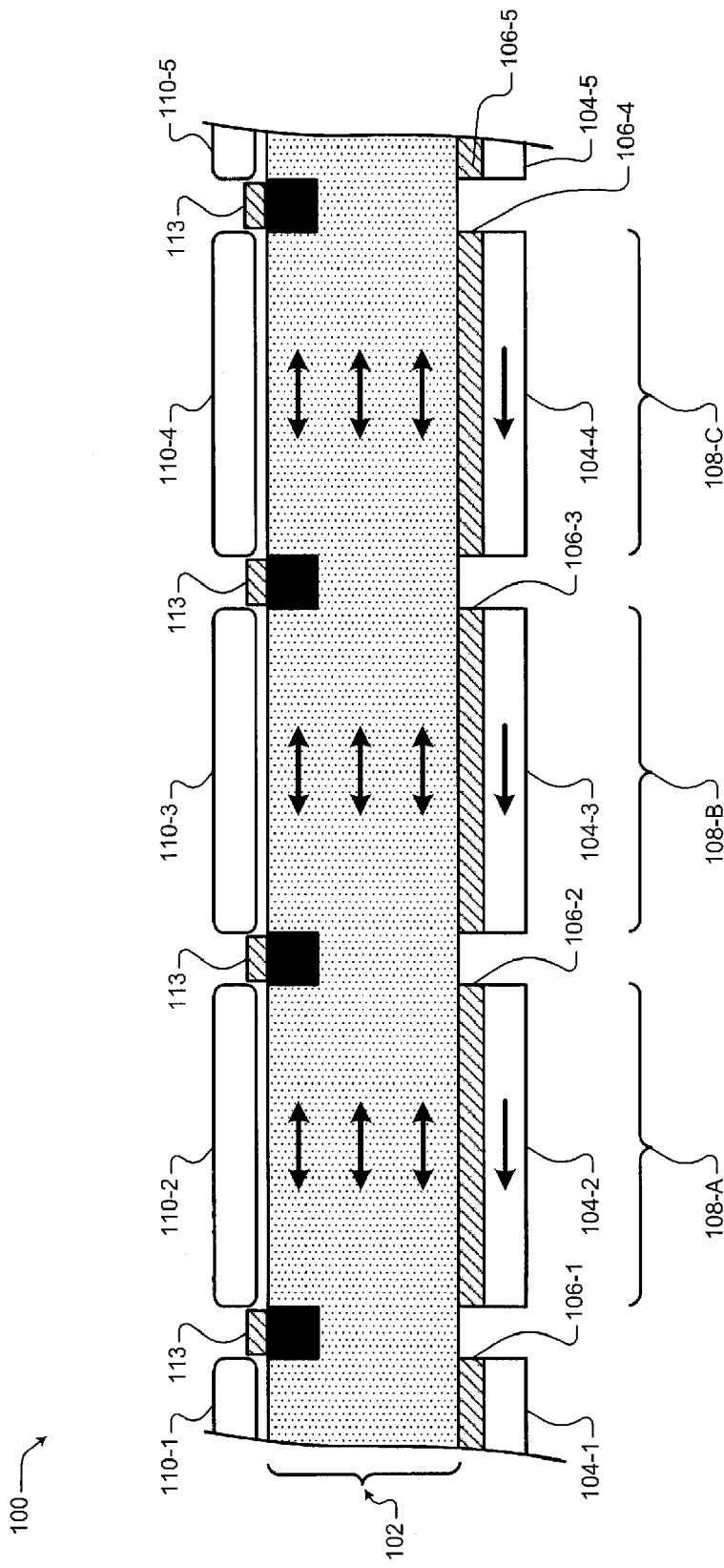
FIG. 2B shows an example array of MTJs that includes strain layers deposited over a portion of a free layer between the MTJs.

In some examples, pinning sites 112 may represent areas of free layer 102 that are modified by a thin-film (i.e., a strain layer) which is deposited over free layer 102. FIG. 2B illustrates an example array 100 of MTJs 108-A, 108-B, 108-C that includes strain layers 113 deposited over free layer 102 in the location of the pinning sites 112. Deposition of a strain layer 113 over top of free layer 102 in the region of the pinning sites 112 may introduce strain into the portions of free layer 102 underlying the strain layers 113. For example, the strain layers 113 may introduce non-uniform strain regions into free layer 102 that may allow for stabilization of a domain wall in the non-uniform strain regions.

Pinning sites 112, as illustrated in FIG. 1, may be arranged at the edges of MTJs 108-A, 108-B, 108-C. In other words, pinning sites 112 may be formed in portions of free layer 102 between adjacent MTJs 108-A, 108-B, 108-C. Therefore, pinning sites 112 may define, in free layer 102, at least a portion of the boundaries of each of MTJs 108-A, 108-B, 108-C.

Pinning sites 112 and write structures 110 may be arranged such that each of the write structures 110 are configured to magnetize corresponding portions of free layer 102 located between pinning sites 112. In other words, each write structure 110 may be configured to magnetize a portion of free layer 102 between two pinning sites 112. For example, write structures 110 of FIG. 1 are positioned relative to free layer 102 and two pinning sites 112 such that one write structure 110 magnetizes a portion of free layer 110 between two pinning sites 112. In other words, each write structure 110 may magnetize a portion of free layer corresponding to a single one of MTJs 108-A, 108-B, 108-C. As illustrated in FIG. 1, write structures 110-2, 110-3, and 110-4 are positioned relative to free layer 102 such that write structures 110-2, 110-3, and 110-4 write to MTJs 108-A, 108-B, and 108-C respectively.

Pinning sites 112 may stabilize domain walls created in the region of free layer 102 near the pinning sites 112. In other words, once a domain wall is formed at (e.g. under) pinning sites 112 between MTJs 108-A, 108-B, 108-C, the domain walls may not readily propagate through free layer 102 in response to thermal energy. If pinning sites 112 were not formed in free layer 102, domain walls in free layer 102 may have a greater tendency to move throughout free layer 102 due to thermal energy. In some examples, the width of the domain wall may be on the order of 500 Angstroms and may ultimately depend on the thickness of free layer 102.

In free layer 102 that uses domain walls for storing information, the write current, write power, and write energy used to nucleate domain walls in the writing process can be lower than the currents used for writing to separate, discontinuous, and uncoupled magnetic elements. In addition, the currents, powers, and energies needed to propagate domain walls between stabilization sites for adjacent MTJs of the present disclosure are relatively low. The energy barriers in MTJs of the present disclosure may be designed to stabilize the domain walls, and therefore establish the state of the MTJs, when the propagating current is removed.

Figure 3:
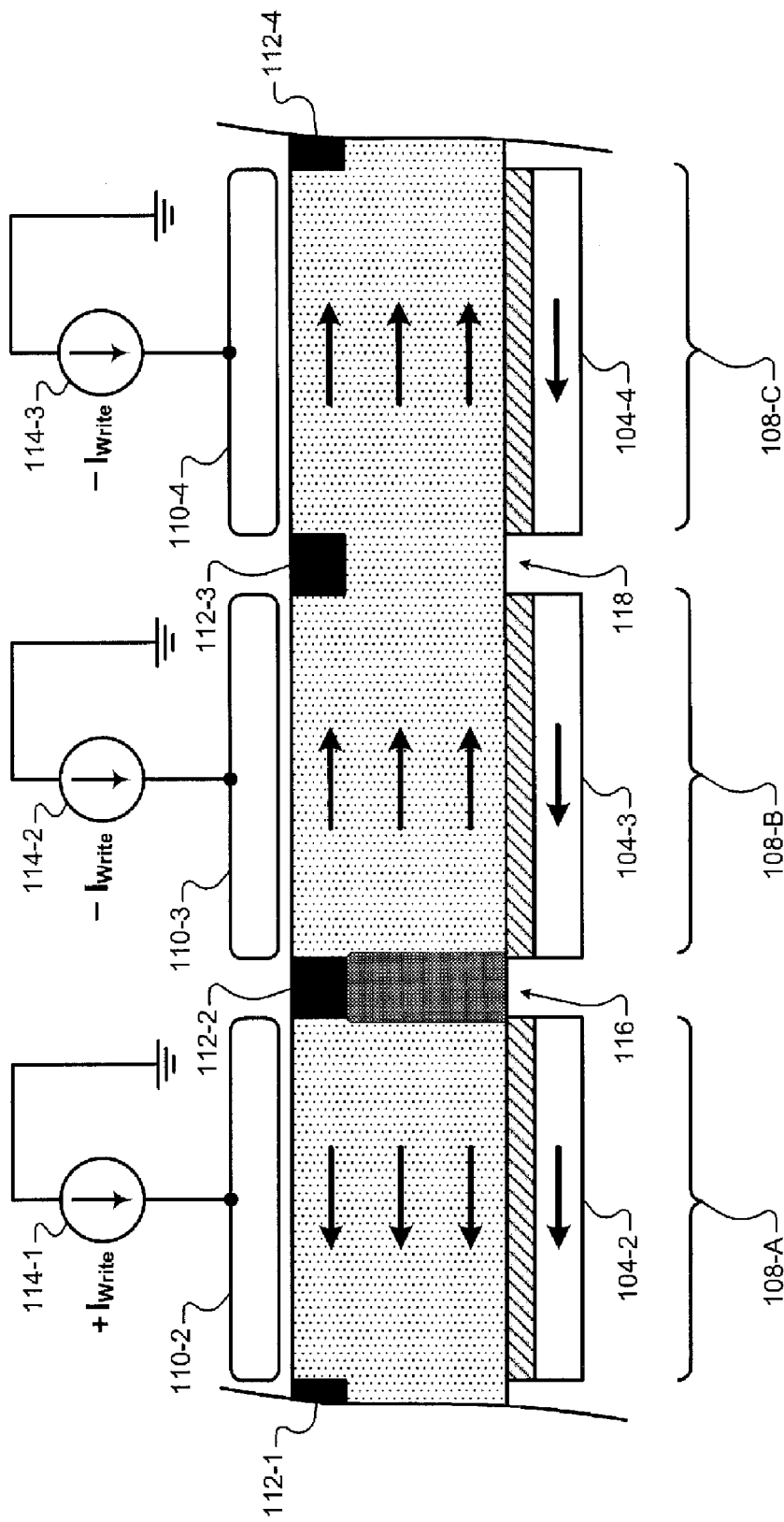
FIG. 3 illustrates the use of write structures to magnetize portions of the common free layer of MTJs.

FIG. 3 illustrates the use of write structures 110 to magnetize portions of free layer 102. Current sources 114-1, 114-2, 114-3 represent write circuits that apply current to write structures 110-2, 110-3, 110-4, respectively. Values of current sources 114-1, 114-2, 114-3 are illustrated as +IWrite and −IWrite. The values of current sources 114-1, 114-2, 114-3 illustrate the direction of current applied to write structures 110 in FIG. 3. Current source 114-1 applies current in the first direction (i.e., +Iwrite). Current sources 114-2, 114-3 apply current in the second direction (i.e., −IWrite). Although current source 114-1 is illustrated as applying current in the first direction and current sources 114-2, 114-3 are illustrated as applying current in the second direction, each current source 114-1, 114-2, 114-3 may selectively apply current in either the first or second direction.

Current source 114-1 magnetizes the portion of free layer 102 that forms an electrode of MTJ 108-A. In other words, current source 114-1 magnetizes the portion of free layer 102 between pinning sites 112-1 and 112-2 that border MTJ 108-A. Current source 114-2 magnetizes the portion of free layer 102 that forms an electrode of MTJ 108-B. Current source 114-3 magnetizes the portion of free layer 102 that forms an electrode of MTJ 108-C.

Magnetization directions of free layer 102 corresponding to MTJs 108-A, 108-B, 108-C are illustrated by single ended arrows, either "←" for the first direction or "→" for the second direction. The portion of free layer 102 corresponding to MTJ 108-A is magnetized in the first direction in response to application of write current "+IWrite" in the first direction. Portions of free layer 102 corresponding to MTJs 108-B, 108-C are magnetized in the second direction in response to application of write current "−Iwrite" in the second direction.

A domain wall 116, illustrated as a darkened region in free layer 102, is formed between MTJ 108-A and MTJ 108-B, which are magnetized in different directions. Pinning site 112-2 may stabilize the domain wall that is formed between MTJ 108-A and MTJ 108-B. In general, a domain wall may be stabilized at any of pinning sites 112 when portions of free layer 102 on opposite sides of (i.e., separated by) pinning sites 112 are magnetized in different directions. As illustrated in FIG. 3, the portion 118 of free layer 102 between MTJ 108-B and MTJ 108-C does not include a domain wall formation since the portions of free layer 102 corresponding to MTJ 108-B and MTJ 108-C are not magnetized in different directions.

Figure 4:
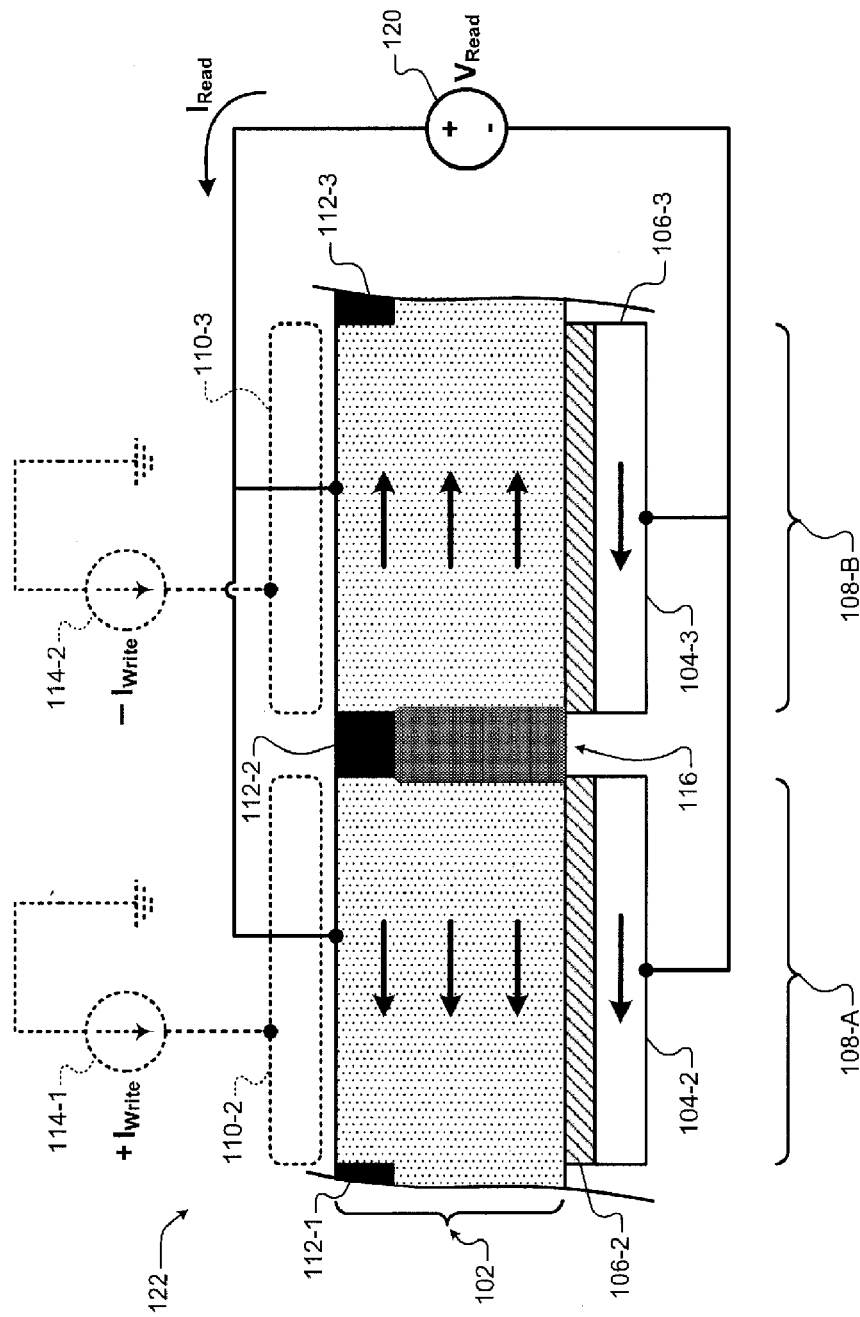
FIG. 4 is a schematic that illustrates biasing of MTJs using voltage $V_{Read}$ in order to generate a current $I_{Read}$ through the MTJs.

Referring now to FIG. 4, biasing of MTJs 108-A, 108-B, e.g., in order to read the states of MTJs 108-A, 108-B is shown. MTJ 108-A and MTJ 108-B are biased using voltage source "$V_{Read}$" 120. $V_{Read}$ 120 may be a constant voltage source, although other voltage sources are contemplated. Current sources 114-1, 114-2 and corresponding write structures 110-2, 110-3 are illustrated using dotted lines to allow for a clear illustration of the connection of $V_{Read}$ 120 to free layer 102.

$V_{Read}$ 120 is connected to free layer 102 and pinned layers 104-2 and 104-3. In other words, $V_{Read}$ 120 is applied across MTJs 108-A, 108-B. $V_{Read}$ 120 generates current "$I_{Read}$." $I_{Read}$ may be equal to the combined current through each of MTJ 108-A and MTJ 108-B. In other words, $I_{Read}$ may be equal to the sum of the current through MTJ 108-A and MTJ 108-B (e.g., through insulating layers 106-2, 106-3). Although $V_{Read}$ 120 is illustrated as connected to two MTJs 108-A, 108-B, in other examples, $V_{Read}$ 120 may be connected to a single MTJ or more MTJs.

Each of MTJs 108-A, 108-B may be in one of a "high resistance state" or a "low resistance state," depending on a direction of magnetization of the portion of free layer 102 corresponding to the MTJ. An MTJ (e.g., 108-B) is in a high resistance state when the magnetization direction of free layer 102 is anti-parallel to the magnetization direction of pinned layer (e.g., 104-2). An MTJ (e.g., 108-A) is in a low resistance state when the magnetization direction of free layer 102 is parallel to the magnetization direction of the pinned layer (e.g., 104-3). As used herein, a write current in the first direction "+IWrite" magnetizes free layer 102 in the first direction "←" and places an MTJ in the low resistance state. Furthermore, a write current in the second direction "−IWrite" magnetizes free layer 102 in the second direction "→" and places an MTJ in the high resistance state.

An MTJ device may transition from the high resistance state to the low resistance state when the portion of free layer associated with the MTJ transitions between magnetization directions. For example, an MTJ device may transition from the high resistance state to the low resistance state when the relative magnetization directions of the electrodes of the MTJ transition from anti-parallel to parallel. During the transition from the high resistance state to the low resistance state, the resistance of an MTJ may be a resistance that has a value between the resistance values of the MTJ in the high and low resistance states.

Since the resistance of MTJs 108-A, 108-B may depend on a direction of magnetization of free layer 102, the magnitude of current "$I_{Read}$" through MTJs 108-A and 108-B may depend on a direction of magnetization of free layer 102. For example, current generated through an MTJ in response to $V_{Read}$ 120 may be at a maximum/minimum value when the MTJ is in the low/high resistance state. Current through an MTJ in response to $V_{Read}$ 120 may transition from a low to a high current during a transition of the MTJ from the low resistance state to the high resistance state, and vice versa.

As described hereinafter with reference to FIGS. 4-11, MTJ 108-A and MTJ 108-B may comprise a logic device used to implement a logic operation. Hereinafter, MTJ 108-A and MTJ 108-B may be referred to collectively as a magnetic logic device 122. Current sources 114-1, 114-2 may serve as inputs to magnetic logic device 122. A magnitude of $I_{Read}$, i.e., a measurement of $I_{Read}$, may serve as the output of magnetic logic device 122. Accordingly, magnetic logic device 122 may be viewed as performing a logic operation on write current inputs (e.g., 114-1, 114-2) to produce a current output $I_{Read}$. Although a logic function is described with reference to two MTJs 108-A and 108-B, other logic functions may be implemented using more or less MTJs of array 100.

Magnetic logic device 122 may operate in at least 3 states, each state corresponding to the resistance (e.g., as seen by $V_{Read}$ 120) associated with magnetic logic device 122. The 3 states may be referred to as the low resistance state, the intermediate resistance state, and the high resistance state. Magnetic logic device 122 may be in the low resistance state when both MTJ 108-A and MTJ 108-B are in the low resistance state. Magnetic logic device 122 may be in the high resistance state when both MTJ 108-A and MTJ 108-B are in the high resistance state. Magnetic logic device 122 may be in the intermediate resistance state when one of MTJ 108-A and MTJ 108-B is in the low resistance state and the other of MTJ 108-A and MTJ 108-B is in the high resistance state.

A magnitude of $I_{Read}$ through magnetic logic device 122 may indicate the state of magnetic logic device 122. Current $I_{Read}$ through magnetic logic device 122 (i.e., the sum of currents through MTJs 108-A, 108-B) may take on at least three discrete values, corresponding to the states of magnetic logic device 122. For example, current $I_{Read}$ may take on a low current value, an intermediate current value, and a high current value. $I_{Read}$ may be described as a high current when magnetic logic device 122 is in the low resistance state since an amount of current through magnetic logic device 122 is at a maximum value when the resistance of magnetic logic device 122 is at a low value. $I_{Read}$ may be described as a low current when magnetic logic device 122 is in the high resistance state since an amount of current through magnetic logic device 122 is at a minimum value when the resistance of magnetic logic device 122 is at a high value. $I_{Read}$ may be described as an intermediate current when magnetic logic device 122 is in the intermediate resistance state since the amount of current through magnetic logic device 122 is at an intermediate value when the resistance of magnetic logic device 122 is at the intermediate value. Note that an intermediate value of $I_{Read}$ indicates that one of MTJ 108-A and MTJ 108-B are in the high resistance state and the other one of MTJ 108-A and MTJ 108-B are in the low resistance state, but may not indicate which of the MTJs 108-A, 108-B is in which state.

Figure 5A:
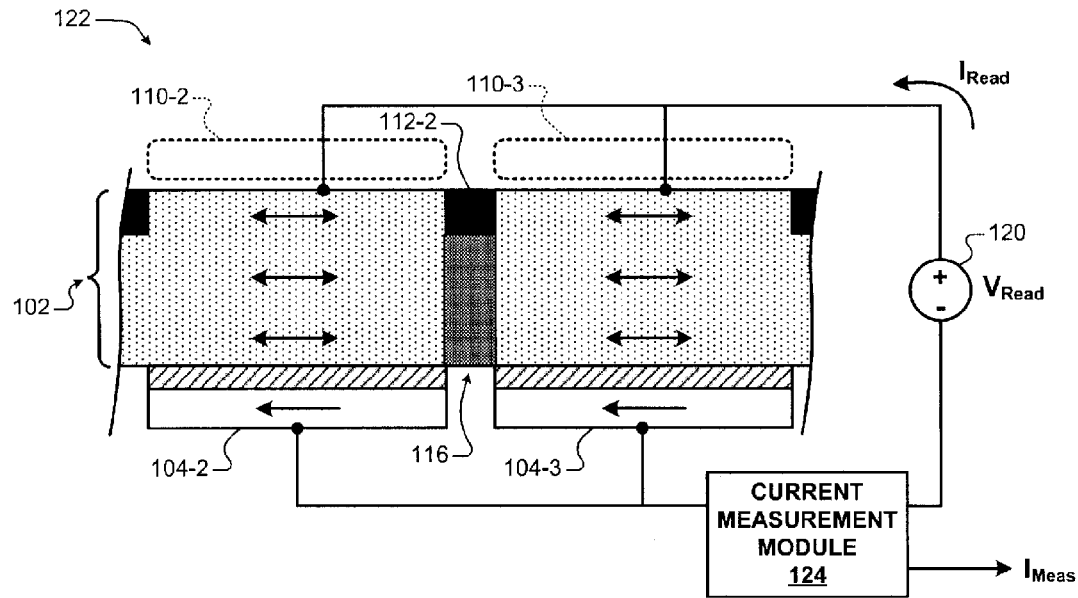
FIG. 5A is a functional block diagram that shows measurement of $I_{Read}$ using a current measurement module.
Figure 5B:
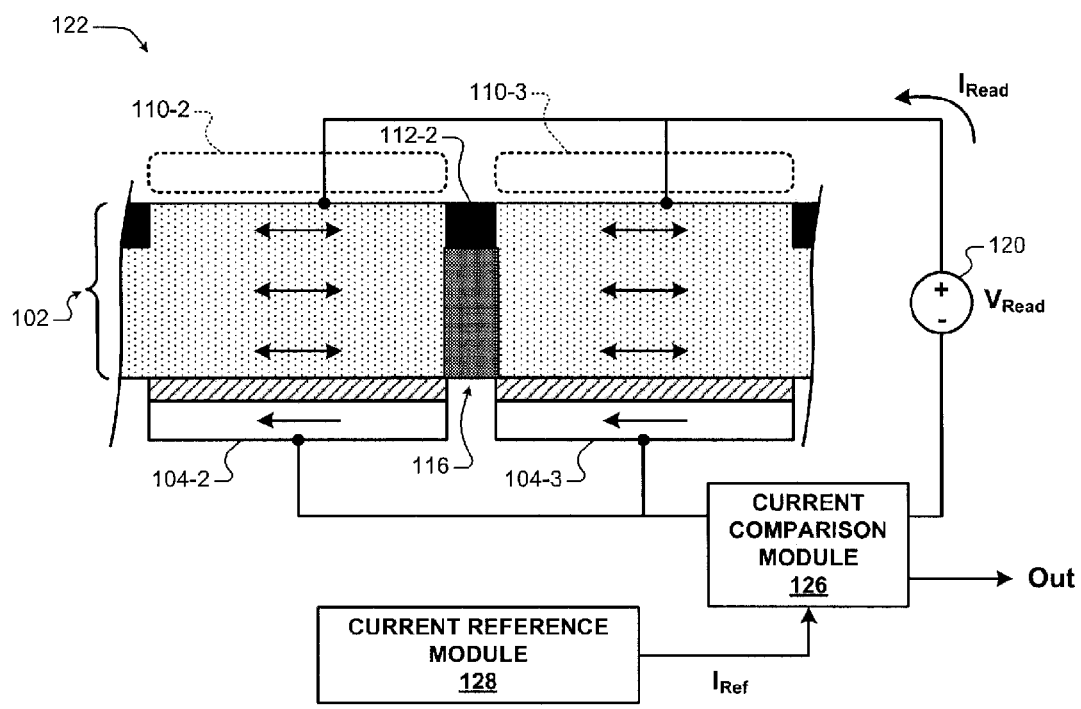
FIG. 5B is a functional block diagram that shows a characterization of $I_{Read}$ relative to a reference current $I_{Ref}$.

Referring now to FIGS. 5A-5B, current $I_{Read}$ may be measured and characterized in various ways. FIG. 5A shows a direct measurement of $I_{Read}$ using a current measurement module 124. FIG. 5B shows a characterization of $I_{Read}$ relative to a reference current $I_{Ref}$, e.g., a characterization of whether $I_{Read}$ is greater than or less than $I_{Ref}$. Each of the techniques for measuring and characterizing $I_{Read}$ are now discussed in turn.

FIGS. 5A-7 and 9A include a current measurement module 124, a current comparison module 126, a current reference module 128, and an output determination module 134. These modules of the present disclosure may include any discrete and/or integrated electronic circuit components that implement analog and/or digital circuits capable of producing the functions attributed to these modules herein. For example, the modules may include analog circuits, e.g., amplification circuits, comparison circuits, filtering circuits, and/or other signal conditioning circuits. The modules may also include digital circuits, e.g., combinational or sequential logic circuits, memory devices, etc. Furthermore, the modules may comprise memory that may include computer-readable instructions that, when executed cause the modules to perform various functions attributed to the modules herein. Memory may include any volatile, non-volatile, magnetic, or electrical media, such as a random access memory (RAM), read-only memory (ROM), non-volatile RAM (NVRAM), electrically-erasable programmable ROM (EEPROM), flash memory, or any other digital media.

Furthermore, Although the modules are illustrated separately in order to highlight their function, the modules may be integrated into a single module. For example, in FIG. 9A, the voltage source $V_{Read}$ 120, current measurement module 124 and output module 134 may be included in a single "control module" that implements the combined functionality of each of these modules.

In FIG. 5A, a current measurement module 124 measures current $I_{Read}$ through magnetic logic device 122. Current measurement module 124 may, for example, filter, amplify, and/or digitize $I_{Read}$ during measurement of $I_{Read}$. Subsequently, current measurement module 124 may output the value of $I_{Read}$, illustrated as $I_{Meas}$ in FIG. 5A. The state of magnetic logic device 122 may be determined based on $I_{Meas}$, as described herein with reference to FIGS. 9A-9B and 11.

In FIG. 5B, current comparison module 126 compares $I_{Read}$ to a reference current $I_{Ref}$ generated by current reference module 128. Current comparison module 126 may output a digital value indicating a magnitude of $I_{Read}$ relative to $I_{Ref}$. For example, current comparison module 126 may output a value of "0" to indicate when $I_{Read}$ is greater than $I_{Ref}$ and may output a value of "1" to indicate when $I_{Read}$ is less than $I_{Ref}$. Current comparison module 126 may include, for example, an amplifier, filter, and comparison circuit that compares $I_{Read}$ to $I_{Ref}$ and outputs a discrete value of "0" or "1."

Current reference module 128 may generate various values of $I_{Ref}$. The value of $I_{Ref}$ generated by current reference module 128 may affect the output value of current comparison module 126. In general, $I_{Ref}$ may be set to a value that is either greater than the intermediate current value of $I_{Read}$ or less than the intermediate current value of $I_{Read}$. The selection of $I_{Ref}$ relative to the intermediate current value of $I_{Read}$ may affect the output value of current comparison module 126. In a first example, current reference module 128 may generate $I_{Ref}$ such that $I_{Ref}$ is greater than the intermediate current value of $I_{Read}$. In this first example, current comparison module 126 may output a value of 0 when $I_{Read}$ is at the high current value, and output a value of 1 when $I_{Read}$ is at the intermediate and low current values. In a second example, current reference module 128 may generate $I_{Ref}$ such that $I_{Ref}$ is less than the intermediate value of $I_{Read}$. In this second example, current comparison module 126 may output a value of 0 when $I_{Read}$ is at the high current value and the intermediate current value, and may output a 1 when $I_{Read}$ is at the low current value.

Figure 6A:
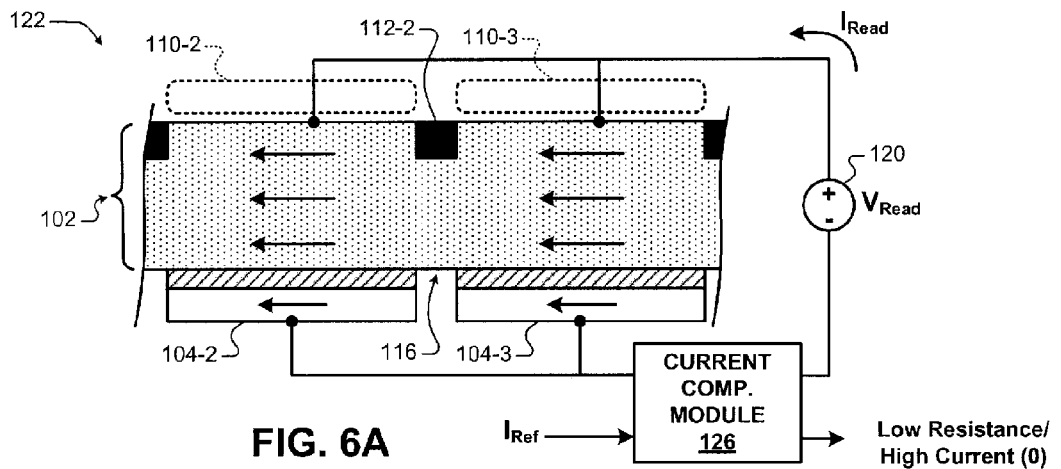
FIGS. 6A-6C show various outputs of a current comparison module that correspond to various states of a magnetic logic device.
Figure 6B:
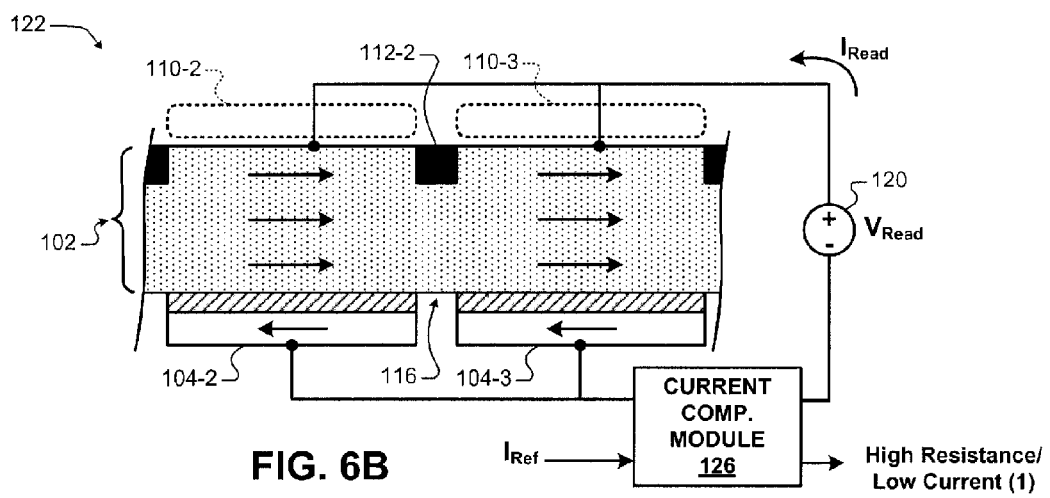
Figure 6C:
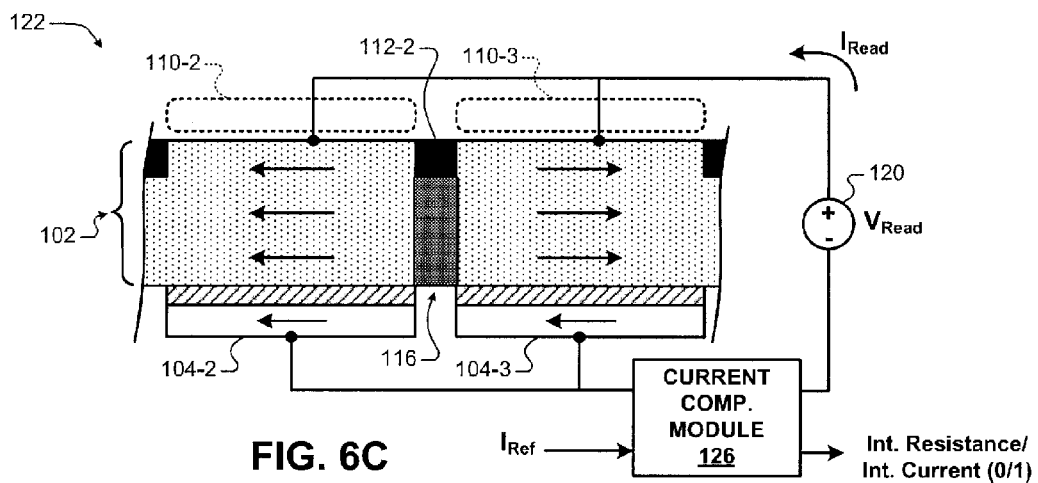

FIGS. 6A-6C show various outputs of current comparison module 126 that correspond to various states of magnetic logic device 122. In FIG. 6A, MTJs 108-A, 108-B are in the low resistance state and magnetic logic device 122 is in the low resistance state, and therefore $I_{Read}$ is at the high current value. Current comparison module 126 outputs a value of 0 to indicate that magnetic logic device 122 is in the low resistance state, regardless of whether $I_{Ref}$ was set to greater than or less than the intermediate current.

In FIG. 6B, MTJs 108-A, 108-B are in the high resistance state and magnetic logic device 122 is in the high resistance state, and therefore $I_{Read}$ is at the low current value. Current comparison module 126 outputs a value of 1 to indicate that magnetic logic device 122 is in the high resistance state, regardless of whether $I_{Ref}$ was set to greater than or less than the intermediate current.

In FIG. 6C, MTJ 108-A is in the low resistance state and MTJ 108-B is in the high resistance state. Accordingly, magnetic logic device 122 is in the intermediate resistance state and $I_{Read}$ is at the intermediate current. Current comparison module 126 may output either a value of 1 or a value of 0, depending on whether $I_{Ref}$ is set to less than or greater than the intermediate current. For example, if $I_{Ref}$ was set to less than the intermediate current, current comparison module 126 would output a value of 0. If $I_{Ref}$ was set to greater than the intermediate current, current comparison module 126 would output a value of 1.

Figure 7:
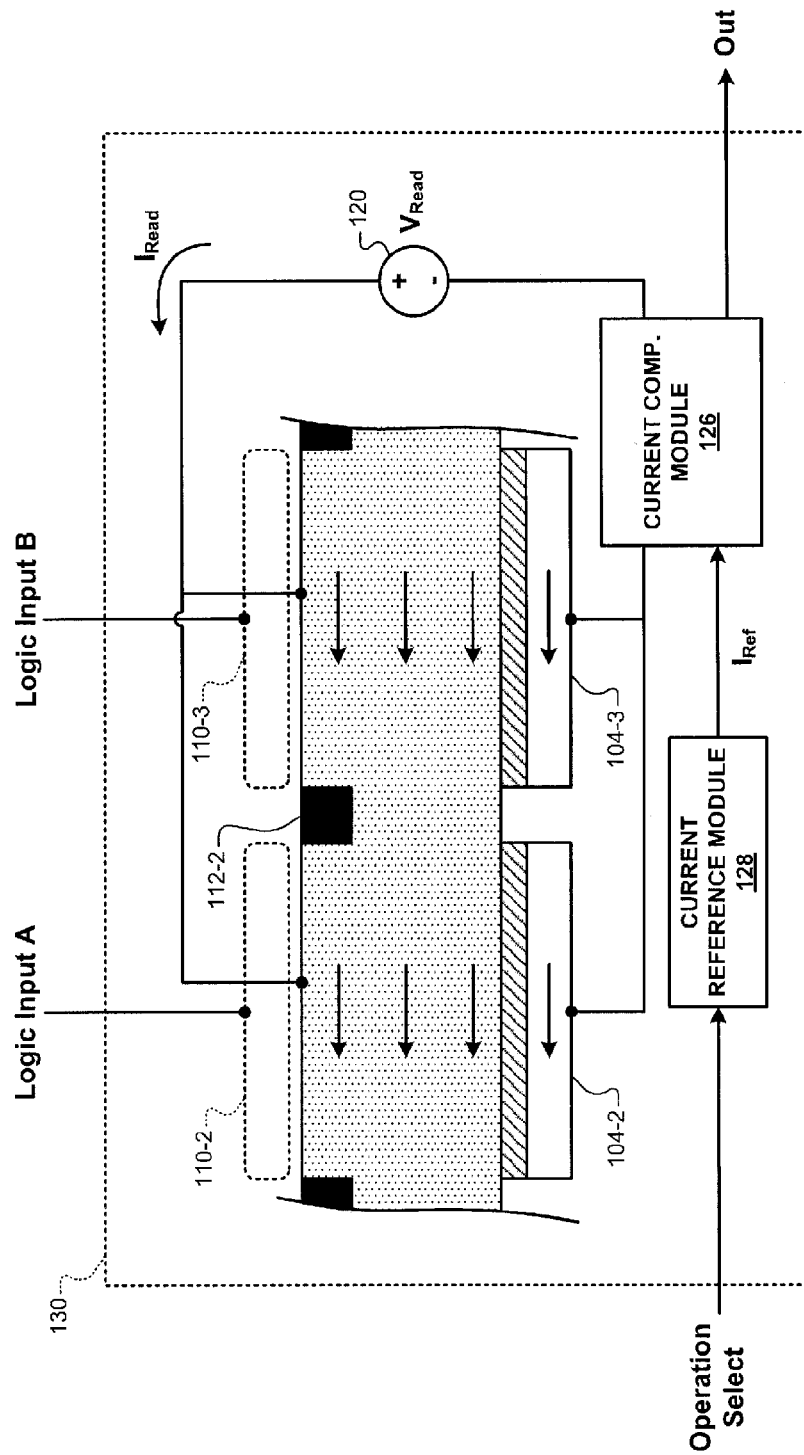
FIG. 7 is a functional block diagram that shows a magnetic logic device included in an example magnetic logic system.

Referring now to FIG. 7, magnetic logic device 122 may be included in an example magnetic logic system 130. Magnetic logic system 130 may selectively perform AND or OR logic operations as described herein. Magnetic logic system 130 may perform such logic operations on logic inputs A and B in order to determine an output of the logic operation, labeled "Out." The output value "Out" of the logic operation performed may in turn indicate the state of magnetic logic device 122.

Magnetic logic system 130 may receive 3 inputs: logic input A, logic input B, and operation select input. Logic input A and logic input B correspond to directions of write currents applied to write structure 110-1 and write structure 110-2, respectively. For example, a logic input 0 applied to either logic input A or B may correspond to a write current in the first direction that magnetizes free layer 102 in the first direction "←." A logic input 1 applied to either logic input A or B may correspond to a write current in the second direction that magnetizes free layer 102 in the second direction "→."

Operation select may be an input (e.g., a digital value) that indicates the desired operation which magnetic logic system 130 implements. In the example of FIG. 7, operation select may indicate the value of reference current $I_{Ref}$. For example, operation select may indicate whether $I_{Ref}$ should be greater than the intermediate current or whether $I_{Ref}$ should be less than the intermediate current. Current reference module 128 generates $I_{Ref}$ based on the operation select input. As described hereinafter, operation select may indicate a desire to implement one of an AND logical operation or an OR logical operation when magnetic logic system 130 includes current comparison module 126 and current reference module 128. In other examples, described hereinafter with respect to FIGS. 9A-9B and 11, a different magnetic logic system may implement a logical exclusive OR (XOR) operation.

In some examples, magnetic logic system 130 may include a fourth input that controls $V_{Read}$ 120, e.g., that may turn $V_{Read}$ 120 on or off. For example, the fourth input may turn on $V_{Read}$ 120 to read the state of magnetic logic device 122 during a read phase, and may turn $V_{Read}$ 120 off during a write phase in which currents are applied to logic input A and/or logic input B. Accordingly, $V_{Read}$ 120 may be selectively applied at various times to determine the state of magnetic logic device 122.

FIGS. 8A-8B show truth tables indicating the logic operations performed by magnetic logic system 130. A truth table for an AND operation is shown in FIG. 8A and a truth table for an OR operation is shown in FIG. 8B. Each truth table includes 4 columns and 4 rows. The columns A and B indicate an input to magnetic logic system 130 and a direction of magnetization of free layer 102 produced in response to inputs A and B. For example, "(0)←" indicates application of a write current in the first direction "+IWrite" and a magnetization of free layer 102 in the first direction in response to "+IWrite." A "(1)→" indicates application of a write current in the second direction "−IWrite" and a magnetization of free layer 102 in the second direction in response to "−IWrite."

The column labeled "R, I" relates information regarding the state of magnetic device 122. For example, "Low R, High I" indicates that magnetic logic device 122 is in the low resistance state (i.e., high current state), "Int R, Int I" indicates that magnetic logic device 122 is in the intermediate resistance state (i.e., intermediate current state), "High R, Low I" indicates that magnetic logic device 122 is in the high resistance state (i.e., low current state).

The column labeled "Out" indicates the output of current comparison module 126. As described above, current comparison module 126 outputs a digital value to indicate a relative magnitude of $I_{Read}$ to $I_{Ref}$. In other words, output of current comparison module 126 indicates whether $I_{Read}$ is greater than or less than $I_{Ref}$. As described above, current comparison module 126 outputs a value of "0" to indicate that $I_{Read}$ is greater than $I_{Ref}$ and outputs a value of "1" to indicate that $I_{Read}$ is less than $I_{Ref}$.

Operation select may indicate a desire to perform an AND operation using magnetic logic system 130. In response to operation select indicating an AND operation, current reference module 128 may set $I_{Ref}$ to a value that is less than the intermediate current through magnetic logic device 122 in order to implement the AND operation. FIG. 8A shows a truth table for magnetic logic system 130 when operation select indicates an AND operation (i.e., when $I_{Ref}$ is set to a value that is less than the intermediate current). As indicated in FIG. 8A, the output of magnetic logic system 130 may be equal to "1" when $I_{Read}$ takes on the low current value. In other words, output of magnetic logic system 130 may be equal to "1" when $I_{Read}$ is less than $I_{Ref}$ (i.e., when $I_{Read}$ takes on the low current value). In other cases, output of magnetic logic system 130 may be equal to "0" to indicate that $I_{Read}$ is greater than $I_{Ref}$ and that magnetic logic device is not in the high resistance (low current) state.

FIG. 8B shows a truth table for magnetic logic system 130 when operation select indicates an OR operation (i.e., when $I_{Ref}$ is set to a value that is greater than the intermediate current). As indicated in FIG. 8B, the output of magnetic logic system 130 may be equal to "0" when $I_{Read}$ takes on the high current value. In other words, the output of magnetic logic system 130 may be equal to "1" when $I_{Read}$ is less than $I_{Ref}$, i.e., when $I_{Read}$ takes on either the intermediate or low current value.

FIG. 9B illustrates a magnetic logic system 132 that implements an XOR operation. FIG. 9B illustrates a truth table corresponding to magnetic logic system 132. Magnetic logic system 132 includes current measurement module 124 that determines $I_{Meas}$ based on $I_{Read}$. As described above, $I_{Meas}$ may be a sampled version of $I_{Read}$. Output determination module 134 determines the output logic value (0/1) of magnetic logic system 132 based on the value of $I_{Meas}$. For example, output determination module 134 determines the output of magnetic logic system 132 based on comparison of the value $I_{Meas}$ to a predetermined value. The predetermined value may be approximately equal to the intermediate current through magnetic logic device 122 in response to application of $V_{Read}$ to magnetic logic device 122. In one example, output determination module 134 may determine that the output of magnetic logic system 132 is "1" when $I_{Meas}$ is approximately equal (e.g., within a threshold amount) to the intermediate current, and may determine that the output of magnetic logic system 132 is equal to "0" when $I_{Meas}$ is not approximately equal (e.g., outside of the threshold amount) to the intermediate current.

FIG. 9A shows the truth table associated with magnetic logic system 132 that implements an XOR function. The column labeled "Out" indicates the output of output determination module 134. As illustrated in the truth table of FIG. 9B, the value "Out" is equal to "1" when $I_{Meas}$ is approximately equal to the intermediate current, and is equal to "0" when $I_{Meas}$ is not approximately equal to the intermediate current.

In summary, magnetic logic systems 130, 132 perform a logic operation on logic inputs A and B to determine a discrete output. In one sense, magnetic logic systems 130, 132 perform a logic operation on logic inputs which may be characterized as currents, or more specifically as current directions. In another sense, magnetic logic systems 130, 132 perform logic operations on the magnetization states of the MTJs, which in turn correspond to the most recent current direction applied to write structures 110. Magnetic logic device 122 may be referred to as a "non-volatile logic device" since the most recent inputs (e.g., the current direction, or magnetization state) are stored in free layer 102 until rewritten, even if power is not applied to a system that includes magnetic logic device 122. For example, upon power-up of the system including magnetic logic device 122, the prior inputs may be determined based on an interrogation (e.g., a measurement or characterization of $I_{Read}$) of magnetic logic device 122. Magnetic logic device 122 therefore differs from typical volatile logic devices in which the state of the inputs may not be stored when power is lost.

Figure 10:
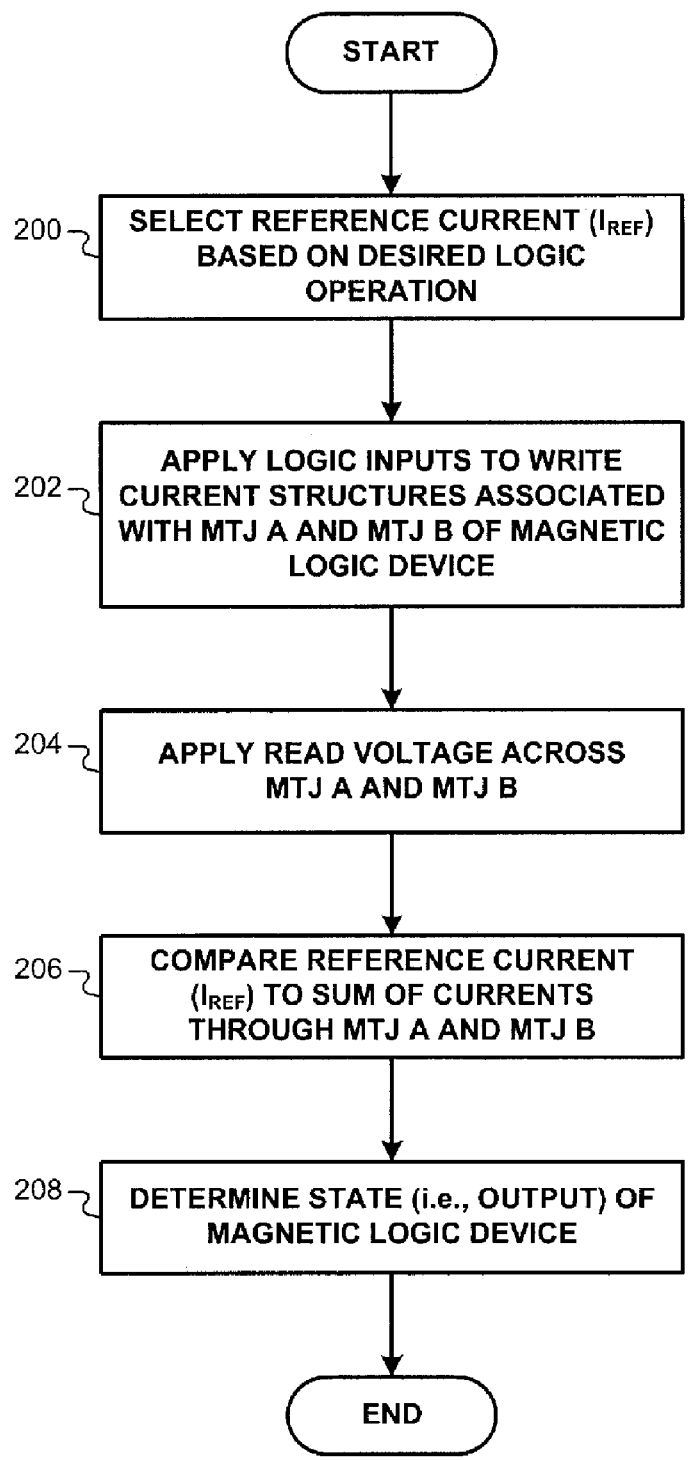
FIG. 10 illustrates a method for performing a logic operation using the magnetic logic system of FIG. 7.

FIG. 10 shows a method for performing a logic operation using the magnetic logic system 130 of FIG. 7. Current reference module 128 sets reference current $I_{Ref}$ based on the operation select input (200). For example, current reference module 128 may set $I_{Ref}$ to a value that is less than the intermediate current value when the operation select input indicates an AND operation. In another example, current reference module 128 may set $I_{Ref}$ to a value that is greater than the intermediate current value when the operation select input indicates an OR operation. Logic inputs A and B (e.g., current sources 114-1, 114-2) are then applied to write structures 110-2, 110-3 to magnetize corresponding portions of free layer 102 (202). Read voltage $V_{Read}$ 120 is applied across MTJ 108-A and MTJ 108-B (204). Current comparison module 126 compares $I_{Ref}$ to the sum of the currents through MTJ 108-A and MTJ 108-B (206). Current comparison module 126 then determines a state of magnetic logic device 122 based on a relative magnitude of $I_{Ref}$ to the sum of the currents through MTJ 108-A and MTJ 108-B (208).

Figure 11:
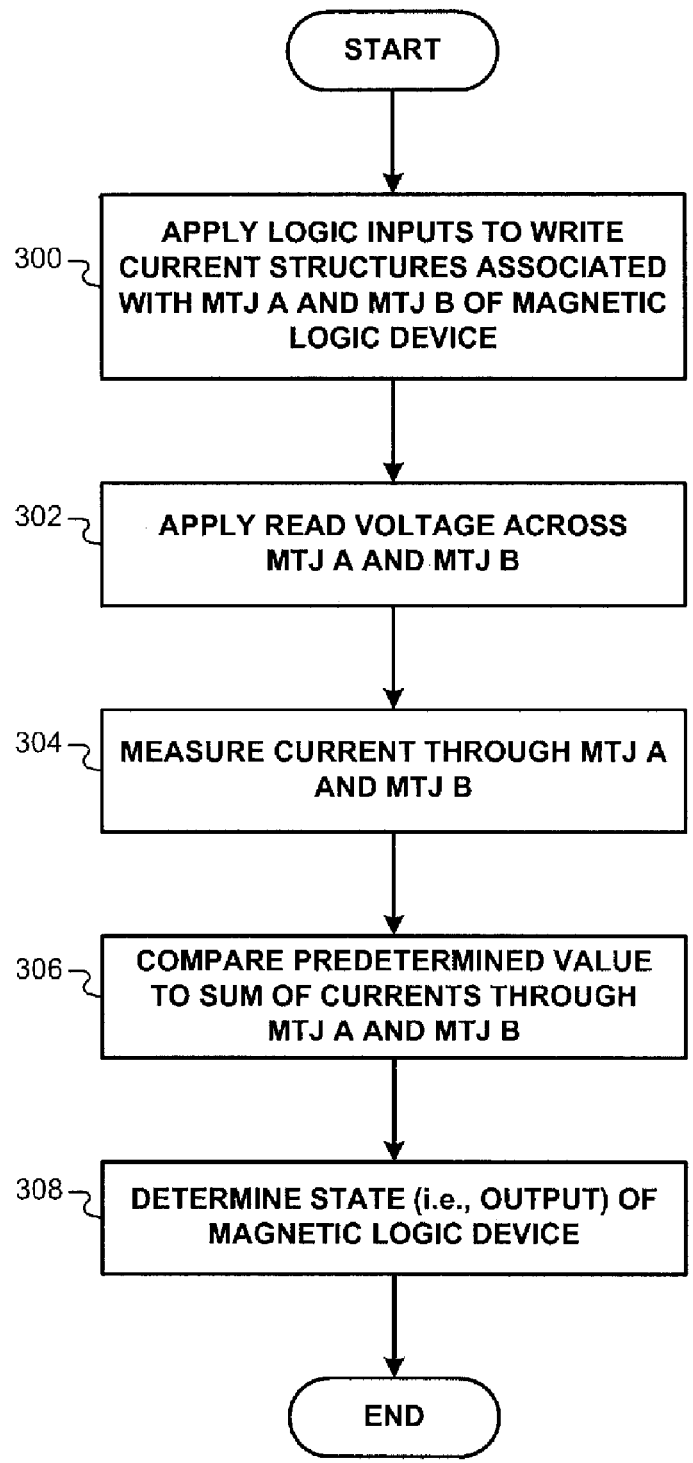
FIG. 11 illustrates a method for performing a logic operation using the magnetic logic system of FIG. 9.

FIG. 11 shows a method for performing a logic operation using the magnetic logic system 132 of FIG. 9A. Logic inputs A and B (e.g., current sources 114-1, 114-2) are applied to write structures 110-2, 110-3 to magnetize corresponding portions of free layer 102 (300). Read voltage $V_{Read}$ 120 is applied across MTJ 108-A and MTJ 108-B (302). Current measurement module 124 determines the sum of the currents ($I_{Meas}$) through MTJ 108-A and MTJ 108-B Meas, (304). Output determination module 134 compares $I_{Meas}$ to a predetermined value that may be approximately equal to the intermediate current (306). Output determination module 134 then determines a state of magnetic logic device 122 based on a relative magnitude of $I_{Meas}$ to the predetermined value (308).

Figure 12:
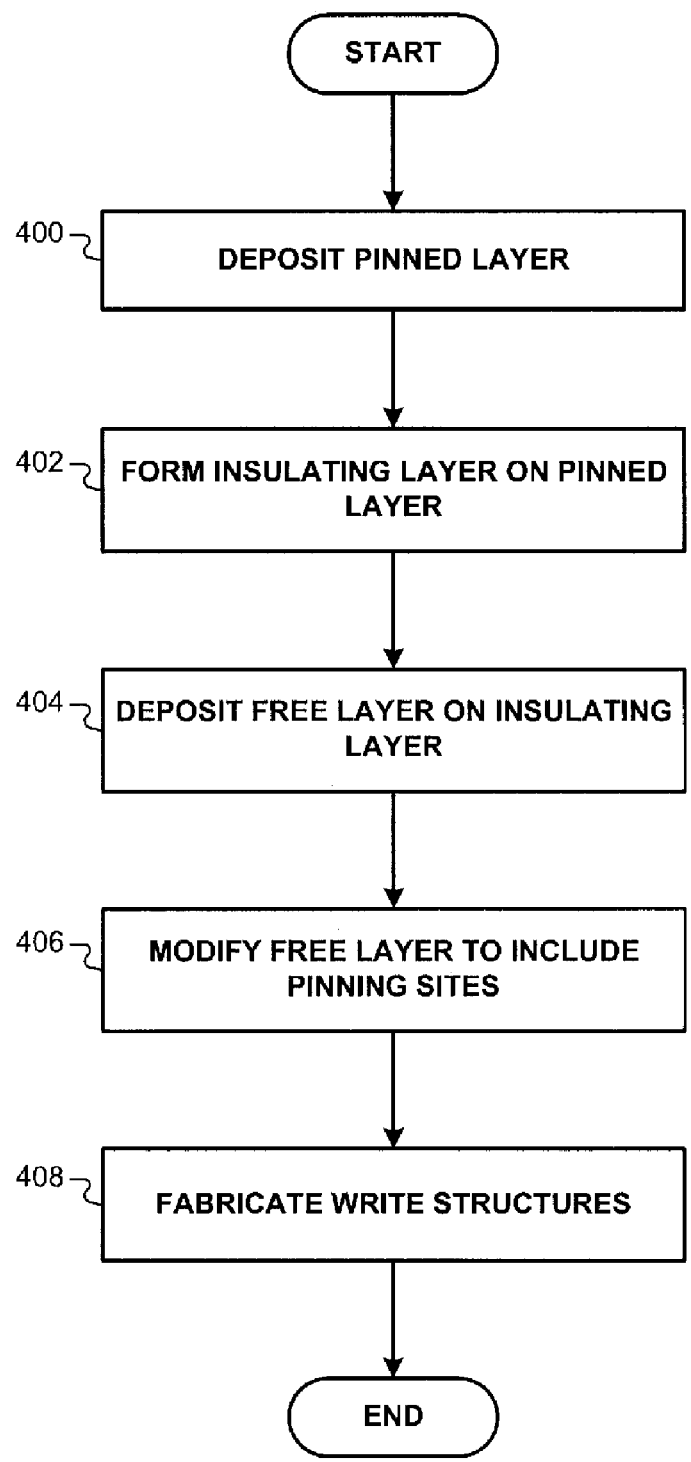
FIG. 12 shows a method for fabricating a magnetic logic device on a substrate.

FIG. 12 shows a method for fabricating a magnetic logic device on a substrate. First, pinned layers 104 may be deposited (400). Insulating layers 106 may then be formed over pinned layers 104 (402). Free layer 102 may then be deposited over pinned layers 104 (404). Free layer 102 is then modified (406) to form pinning sites 112. For example, free layer 102 may be notched using an etching process, implanted with ions using an ion implantation process, and/or be covered with a strain layer 113 in pinning sites 112. Write structures 110 may then be fabricated such that write structures 110 are arranged to magnetize portions of free layer 102 that correspond to MTJs of array 100 (408).

Various examples have been described. These and other examples are within the scope of the following claims.

The invention claimed is:

1. A system comprising:
   a first ferromagnetic layer;
   a first magnetic tunnel junction (MTJ) device comprising a first portion of the first ferromagnetic layer, a first pinned layer, and a first insulating layer disposed between the first portion of the first ferromagnetic layer and the first pinned layer;
   a second MTJ device comprising a second portion of the first ferromagnetic layer, a second pinned layer, and a second insulating layer disposed between the second portion of the first ferromagnetic layer and the second pinned layer; and
   first and second write structures configured to receive current and generate a magnetic field that magnetizes the first and the second portions of the first ferromagnetic layer, respectively.

2. The system of claim 1, further comprising a modification to the first ferromagnetic layer between the first and second portions of the first ferromagnetic layer, wherein the modification is configured to stabilize a magnetic domain wall located in the region of the modification.

3. The system of claim 2, wherein the modification includes an ion implantation region.

4. The system of claim 2, wherein the modification includes a notch that is defined in the first ferromagnetic layer.

5. The system of claim 2, wherein the modification comprises a thin-film deposited over the first ferromagnetic layer, and wherein the thin-film is deposited such that the thin-film introduces strain in the first ferromagnetic layer and stabilizes a domain wall located in the region of the thin-film.

6. The system of claim 1, wherein the first and second insulating layers form a single continuous layer along the first ferromagnetic layer.

7. The system of claim 6, wherein the first and second pinned layers form a single continuous layer along the single continuous insulating layer.

8. The system of claim 2, wherein the first and second write structures are configured to magnetize the first and the second portions of the first ferromagnetic layer without magnetizing the first and second pinned layers.

9. The system of claim 2, further comprising a control module that applies a voltage across the first and second MTJ devices, and that determines directions of magnetization of the first and second portions of the first ferromagnetic layer based on an amount of current generated in response to the application of the voltage.

10. The system of claim 9, wherein the control module measures the amount of current generated in response to the application of the voltage and that determines the directions of magnetization of the first and second portions of the first ferromagnetic layer based on the measurement.

11. The system of claim 9, wherein the control module generates a reference current, compares the amount of current generated with the reference current, and determines the directions of magnetization of the first and second portions of the first ferromagnetic layer based on which of the generated current or the reference current is greater.

12. A system comprising:
a continuous thin-film ferromagnetic layer including N modified regions, each of the N modified regions configured to stabilize a magnetic domain wall located in the continuous thin-film ferromagnetic layer;
N magnetic tunnel junction (MTJ) devices, each of the N MTJ devices comprising one of N portions of the continuous thin-film ferromagnetic layer, wherein adjacent MTJ devices of the N MTJ devices are separated by one of the N modified regions; and
N write structures, each of the N write structures configured to receive current and generate a magnetic field that magnetizes a different one of the N portions of the continuous thin-film ferromagnetic layer, wherein N is an integer greater than 2.

13. The system of claim 12, wherein each of the N modified regions include at least one of an ion implantation region, a notch defined in the continuous thin-film ferromagnetic layer, or a strained region defined by a thin-film deposited over the modified region.

14. The system of claim 12, wherein each of the N MTJ devices includes an insulating layer and a pinned layer.

15. The system of claim 12, further comprising a control module that applies a voltage across one or more of the N MTJ devices, and that determines directions of magnetization of one or more of the N portions of the continuous thin-film ferromagnetic layer corresponding to the one or more of the N MTJ devices based on an amount of current generated in response to the application of the voltage.

16. A method comprising:
fabricating first and second magnetic tunnel junction (MTJ) devices adjacent to one another such that the first and second MTJ devices share a continuous ferromagnetic layer;
modifying the continuous ferromagnetic layer at a location between the first and second MTJ devices such that the modification is configured to stabilize a magnetic domain wall located in the continuous ferromagnetic layer at the location; and
fabricating first and second write structures configured to receive current and generate a magnetic field that magnetizes first and the second portions of the continuous ferromagnetic layer corresponding to the first and second MTJ devices, respectively.

17. The method of claim 16, wherein the first and second MTJ devices each include an insulating layer and a pinned layer, and wherein the first and second write structures are configured to magnetize the first and second portions without magnetizing the pinned layers of the MTJ devices.

18. The method of claim 16, wherein modifying the continuous ferromagnetic layer includes forming a notch in the surface of the continuous ferromagnetic layer at the location between the first and second MTJ devices.

19. The method of claim 16, wherein modifying the continuous ferromagnetic layer includes implanting ions in the continuous ferromagnetic layer at the location between the first and second MTJ devices.

20. The method of claim 16, wherein modifying the continuous ferromagnetic layer includes depositing a thin-film over the continuous ferromagnetic layer at the location between the first and second MTJ devices, and wherein the thin-film is configured such that the thin-film introduces strain in the continuous ferromagnetic layer and stabilizes a domain wall at the location.

* * * * *